(12) United States Patent
Mourrier

(10) Patent No.: US 7,382,301 B2
(45) Date of Patent: Jun. 3, 2008

(54) METHOD AND APPARATUS FOR CONVERTING PWM SIGNAL TO ANALOG OUTPUT VOLTAGE

(75) Inventor: Andre Mourrier, Sainte Tulle (FR)

(73) Assignee: International Rectifier Corporation, El Segundo, CA (US)

( * ) Notice: Subject to any disclaimer, the term of this patent is extended or adjusted under 35 U.S.C. 154(b) by 732 days.

(21) Appl. No.: 10/974,581

(22) Filed: Oct. 27, 2004

(65) Prior Publication Data

US 2005/0093730 A1    May 5, 2005

Related U.S. Application Data

(60) Provisional application No. 60/516,202, filed on Oct. 31, 2003.

(51) Int. Cl.
*H03M 1/82* (2006.01)

(52) U.S. Cl. .................................... 341/152; 341/144

(58) Field of Classification Search ................ 341/144, 341/152; 375/238
See application file for complete search history.

(56) References Cited

U.S. PATENT DOCUMENTS 3,651,317 A    3/1972    Falk ........................ 235/197
4,064,423 A  * 12/1977   Atkisson, Jr. ............... 708/272
4,233,591 A  * 11/1980   Murata et al. .............. 341/145
5,277,497 A  *  1/1994   Enomoto .................... 377/114
6,445,326 B1    9/2002   Donovan et al. ........... 341/155
2002/0047692 A1  4/2002  Pierret et al. .............. 322/28

FOREIGN PATENT DOCUMENTS

DE    198 09 334    9/1999

* cited by examiner

*Primary Examiner*—Peguy JeanPierre
(74) *Attorney, Agent, or Firm*—Ostrolenk, Faber, Gerber & Soffen, LLP

(57) ABSTRACT

A circuit for converting a duty cycle of a pulse width modulated signal to an analog value comprising a clock signal generator for generating a clock signal, a window generation circuit for generating a window signal synchronized with the pulse width modulated signal having a window having a window start and a window termination, a counter drive circuit receiving the clock signal, the pulse width modulated signal and the window signal and producing a counter input signal, a counter circuit for counting pulses of the counter input signal and providing a counter output, a reset circuit for resetting the counter at the termination of the window; and a digital to analog converter for converting the counter output at the termination of the window to the analog value.

20 Claims, 3 Drawing Sheets

METHOD AND APPARATUS FOR CONVERTING PWM SIGNAL TO ANALOG OUTPUT VOLTAGE

CROSS REFERENCE TO RELATED APPLICATION

This application claims the benefit and priority of U.S. Provisional Application Ser. No. 60/516,202 filed Oct. 31, 2003 entitled BLOWER STRUCTURE WITH CONVERSION OF PWM DUTY CYCLE TO OUTPUT VOLTAGE, the entire disclosure of which is incorporated herein by reference.

BACKGROUND OF THE INVENTION

The present invention relates to a method and apparatus for converting a PWM (pulse width modulation) signal to an analog output signal. PWM signals have a duty cycle which is the ratio of the time that the pulse is on to the period of the pulse width modulated signal, as determined by the PWM frequency. The duty cycle must often be converted to an analog signal to control an analog device, for example, a motor such as the motor of a blower structure in an automobile.

There are known methods to accomplish this. In one existing system, a division operation is implemented. To decode the PWM signal, a mathematical division operation is performed. Such a system measures the PWM signal period and the low level signal time and does a division of the former by the total period (sum of high and low level times) to determine the duty cycle value. However, designing a division operation in silicon is often difficult and complex.

Another system uses a phase locked and loop (PLL). However, the implementation of a PLL is also complex.

Another simpler solution is an RC (resistor-capacitor) network. This solution is very simple but the RC value must be tailored to the specific PWM frequency and thus does not provide a universal solution.

Accordingly, it is an object of the invention to provide a system for converting a PWM signal to an analog output signal and in particular, a system for converting the PWM duty cycle value to an analog signal and which is independent of input PWM frequency as well as any internal clock signal frequency variations.

SUMMARY OF THE INVENTION

According to one aspect, the invention comprises a circuit for converting a duty cycle of a pulse width modulated signal to an analog value comprising a clock signal generator for generating a clock signal, a window generation circuit for generating a window signal synchronized with the pulse width modulated signal having a window having a window start and a window termination, a counter drive circuit receiving the clock signal, the pulse width modulated signal and the window signal and producing a counter input signal, a counter circuit for counting pulses of the counter input signal and providing a counter output, a reset circuit for resetting the counter at the termination of the window; and a digital to analog converter for converting the counter output at the termination of the window to the analog value.

According to another aspect, the invention comprises a method for converting a duty cycle of a pulse width modulated signal to an analog value comprising: generating a clock signal, generating a window signal synchronized with the pulse width modulated signal having a window having a window start and a window termination, receiving the clock signal, the pulse width modulated signal and the window signal and producing a counter input signal, counting pulses of the counter input signal and providing a counter output, resetting the step of counting at the termination of the window, and converting the counter output at the termination of the window to the analog value.

According to one embodiment of the invention, a digital decoder without a division operation is provided. This decoder has an internal clock that generates a fixed width window signal called a calculation window signal. The window is fixed to the internal clock frequency, but varies inversely with the clock frequency. In this way, if the clock frequency increases, the window decreases and vice versa, thereby allowing the counter to count to the same value for the same duty cycle and making the circuit independent of variations in the clock frequency. The window signal is synchronized with the input PWM signal rising edge. It could be synchronized in another way. The counter is enabled to count only during the calculation window and only during the time of a PWM pulse, i.e., during the duty cycle portion of the PWM period. When the calculation window signal terminates, a latch transmits the output of the counter to a digital to analog converter. The conversion result is directly proportional to the PWM duty cycle. After a delay, the counter is cleared and the calculation sequence can begin again for the next PWM pulse.

Accordingly, the final result does not depend on the internal clock frequency or on the PWM frequency but depends only on the ratio between the calculation window, the internal clock frequency and the PWM duty cycle. Even with a less than fully accurate internal frequency, a good PWM converter can be designed. To obtain high accuracy, the internal clock frequency must be higher than the maximum allowable PWM frequency.

Other objects, features and advantages of the present invention will be appreciated upon a review of the following detailed description.

Other features and advantages of the present invention will become apparent from the following description of the invention which refers to the accompanying drawings.

BRIEF DESCRIPTION OF THE DRAWING(S)

The invention will now be described in the following detailed description with reference to the drawings in which.

DETAILED DESCRIPTION OF THE INVENTION

Figure 1:
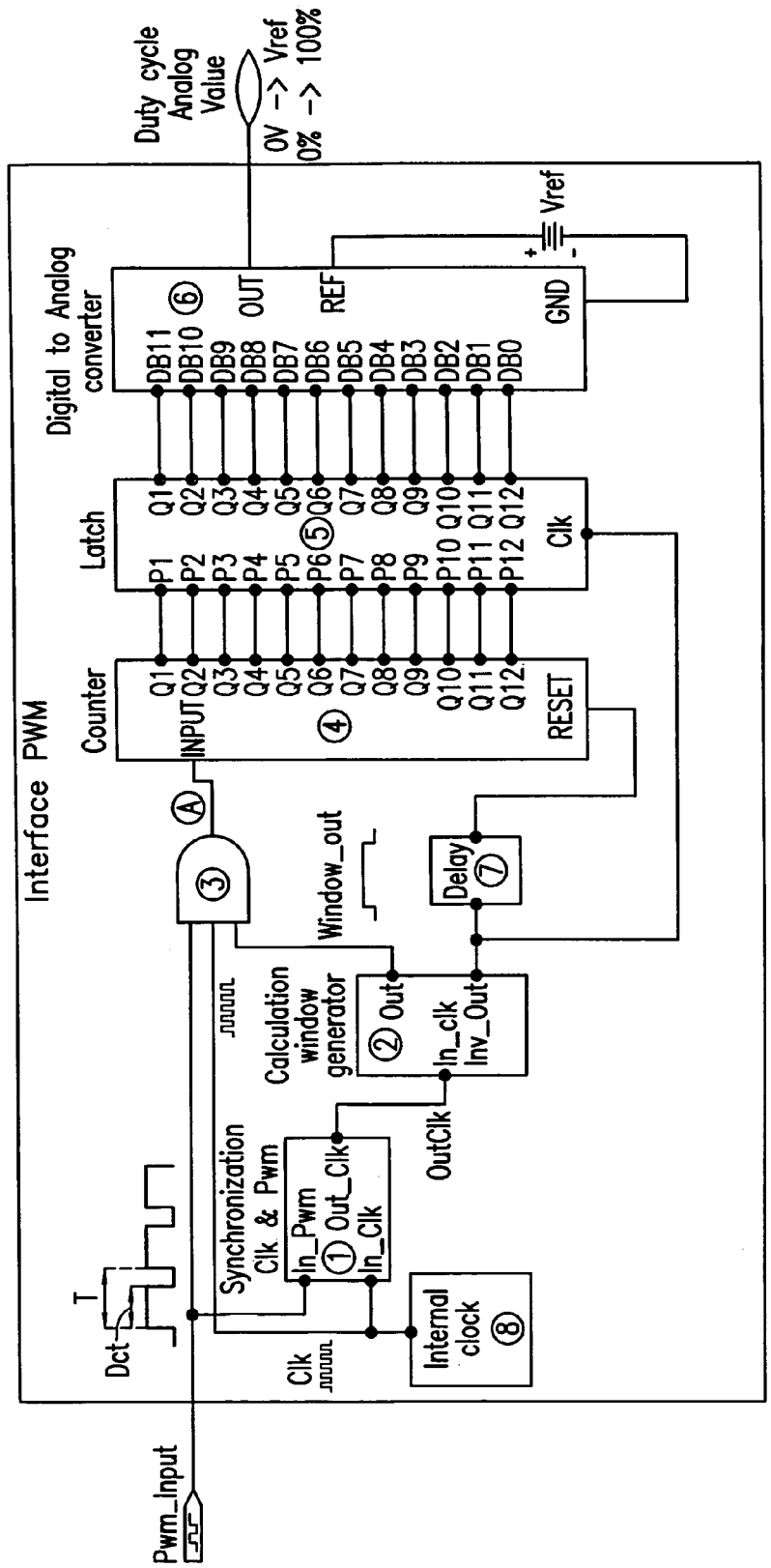
FIG. 1 shows a schematic diagram of the PWM to analog output converter circuit according to the present invention.

With reference now to the drawings, FIG. 1 shows the schematic diagram of the PWM duty cycle to analog output signal decoder circuit according to the present invention which converts PWM duty cycle to an analog value. The decoder circuit has an internal clock 8 that generates an internal clock signal. See FIG. 2. The clock signal is synchronized with the PWM signal rising edge by the synchronization circuit 1. As shown, the input PWM signal has a period T and duty cycle portion DC. Synchronization circuit 1 produces an output OUTCLK synchronized to a rising edge of the PWM input signal. The output of the synchronization circuit 1 is coupled to the input of the calculation window generator circuit 2, which may be, for example, a one-shot circuit. Its output is a calculation window signal WINDOWOUT having a fixed time window for a specified clock frequency. See FIG. 2. The window is fixed to the internal clock frequency, but varies inversely with the clock frequency. In this way, if the clock frequency increases, the window decreases and vice versa, thereby allowing the counter to count to the same value for the same duty cycle and making the circuit independent of variations in the clock frequency.

In an illustrative embodiment, the calculation window duration is about 1/internal clock frequency/4000. The internal clock frequency is illustratively 60 KHz.

The signal WINDOWOUT, the input PWM signal and the internal clock signal CLK are fed to logic gate 3, in the embodiment shown, an AND gate 3. A counter 4 is enabled by the AND gate 3 to count internal clock pulses from the clock 8 only during the time period when both the calculation window signal and the PWM signal are high. See signal A in FIGS. 1 and 2. Thus, clock pulses are counted by counter circuit 4 only during the time period of the input PWM signal pulse, i.e., during the duty cycle portion of the input PWM pulse, and only during the calculation window. When the calculation window signal goes low, the counter will be reset and stop counting after a small time delay due to the inverted window signal provided at the reset input by delay circuit 7. Just before reset, the latch 5 will latch and transmit the counter output value to a digital to analog converter 6. The conversion result is directly proportional to the PWM duty cycle. When the output of the calculation window generator 2 goes low, its inverse output goes high, and the delay stage 7 resets the counter. The latch 5 is clocked by the same inverse output signal to latch onto the output of the counter just prior to counter reset. When the counter is reset by the delay circuit 7, the window calculation sequence can start again at the next PWM rising edge.

The final result does not depend on the internal clock frequency nor does it depend on the PWM frequency. It depends only on the ratio between the calculation window, the internal clock frequency and PWM duty cycle. With a less than completely accurate internal clock frequency, a good PWM converter can still be provided. To have good accuracy, the internal clock frequency must be higher than the maximum allowable PWM frequency.

Figure 2:
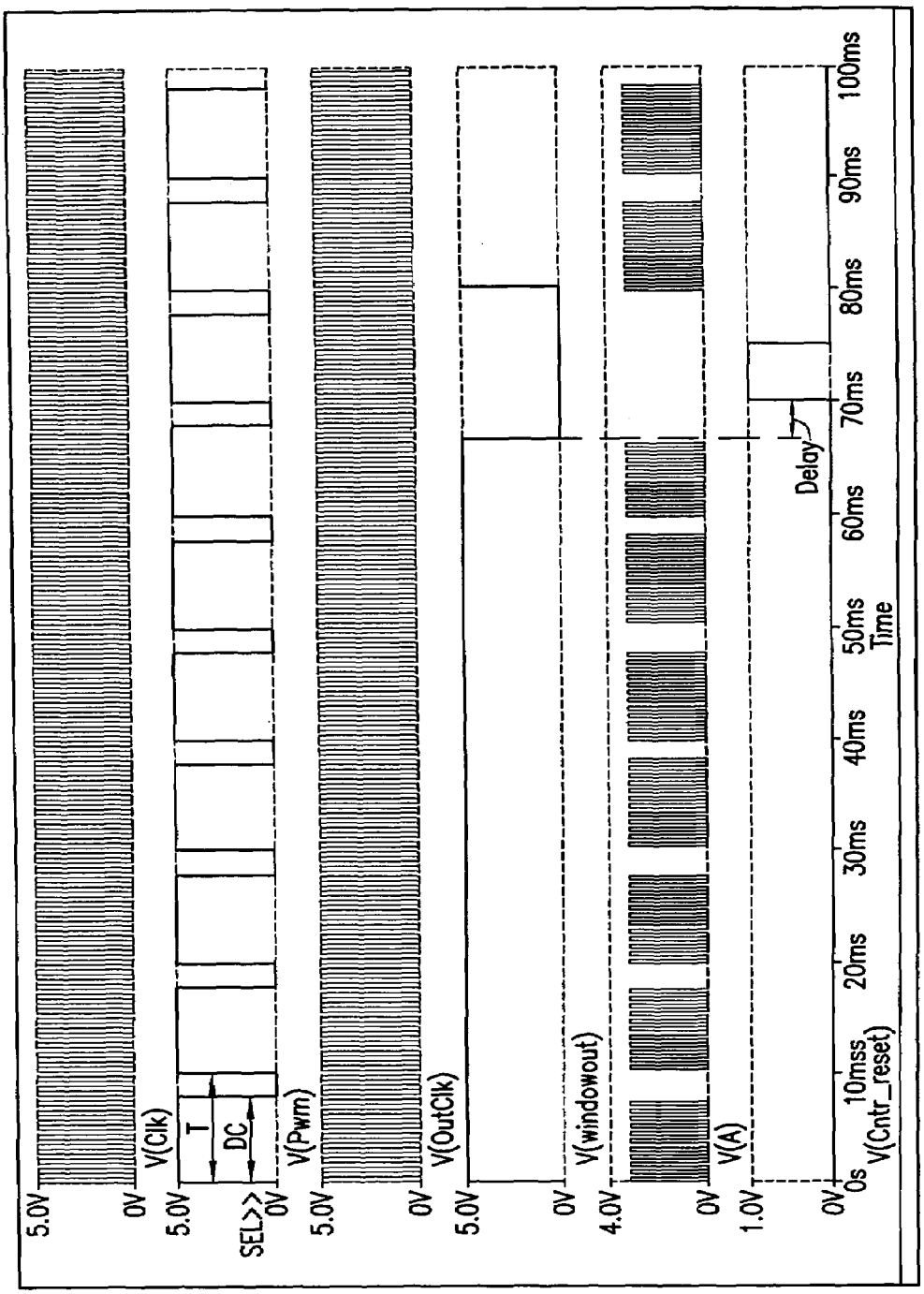
FIG. 2 shows a timing diagram for the circuit of FIG. 1.

FIG. 2 shows waveforms of the circuit of FIG. 1. The clock signal CLK is shown. The PWM input signal is shown which is not initially synchronized to the clock frequency. The output of circuit 1 is the synchronized signal OUTCLK shown in FIG. 2. The window signal WINDOWOUT is also shown. The output of AND gate 3 (Signal A) includes clock pulses only during the calculation window and only during the PWM duty cycle time. The counter 4 counts these clock pulses to produce a count proportional to the duty cycle, which is then latched by latch 5 and converted to an analog value by D/A converter 6.

Figure 3:
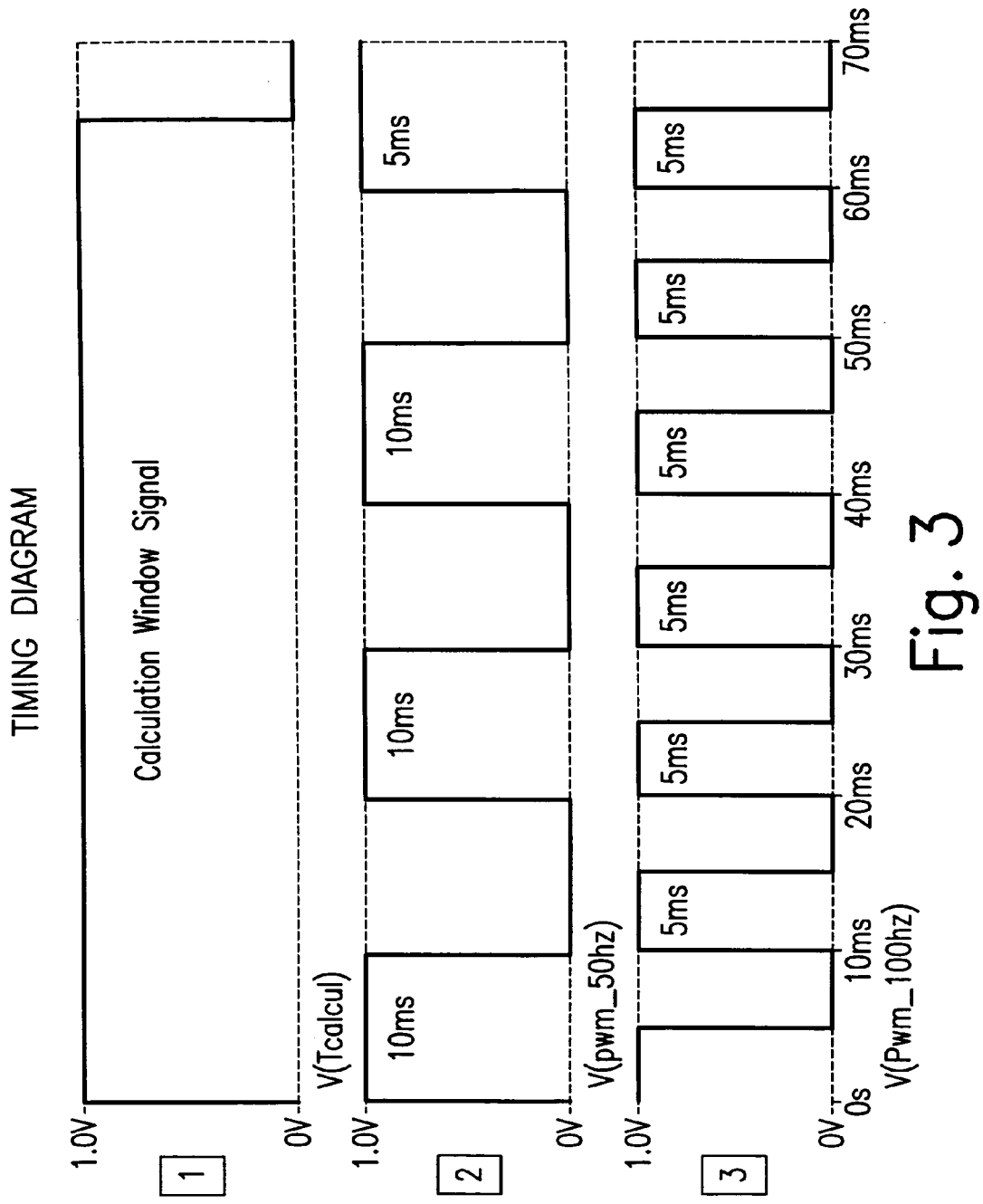
FIG. 3 shows exemplary PWM input signals and the calculation window, showing how the circuit provides a value independent of PWM frequency.

FIG. 3 shows how the output is independent of PWM frequency. FIG. 3 shows two input PWM frequencies one at 50 HZ with a 50% duty cycle and another at 100 Hz with a 50% duty cycle. The calculation window is fixed (by the internal clock) at 65 msec. For the 50 Hz signal, the counter 4 will count clock pulses for 3.5 duty cycle portions of the PWM signal, each having a duty cycle portion of 10 ms, totaling 35 msec.

For the 100 Hz PWM signal, the counter 4 will count clock pulses during a total of 7 duty cycle portions of the PWM signal, also for a total of 35 msecs, as each duty cycle portion is 5 msecs. In each case, the same duty cycle, illustratively 50%, for a different PWM frequency, has been converted to the same counter value, and thus the same final analog output value.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for converting a duty cycle of a pulse width modulated signal to an analog value comprising:
   a clock signal generator for generating a clock signal;
   a window generation circuit for generating a window signal synchronized with the pulse width modulated signal having a window having a window start and a window termination;
   a counter drive circuit receiving the clock signal, the pulse width modulated signal and the window signal and producing a counter input signal;
   a counter circuit for counting pulses of the counter input signal and providing a counter output;
   a reset circuit for resetting the counter at the termination of the window; and
   a digital to analog converter for converting the counter output at the termination of the window to the analog value.

2. The circuit of claim 1, further comprising a circuit for synchronizing the pulse width modulated signal to the clock signal.

3. The circuit of claim 2, further comprising a latch circuit for latching the counter output and providing a latched counter output to the digital to analog converter.

4. The circuit of claim 3, wherein the reset circuit comprises a circuit for providing a reset signal to the counter circuit to reset the counter circuit.

5. The circuit of claim 4, further comprising a circuit for setting the latch circuit at the termination of the window.

6. The circuit of claim 3, further comprising a delay circuit for resetting the counter circuit after latching of the counter output by the latch circuit.

7. The circuit of claim 1, wherein the window is a fixed time duration from start to termination for a specified clock signal frequency.

8. The circuit of claim 7, wherein the fixed time duration of the window varies inversely as the clock signal frequency.

9. The circuit of claim 1, wherein the counter circuit counts clock pulses of the clock signal only during the window of the window signal and only during a duty cycle portion of the pulse width modulated signal.

10. The circuit of claim 1, wherein the counter output is independent of the frequency of the pulse width modulated signal and the clock signal.

11. A method for converting a duty cycle of a pulse width modulated signal to an analog value comprising:
   generating a clock signal;
   generating a window signal synchronized with the pulse width modulated signal having a window having a window start and a window termination;
   receiving the clock signal, the pulse width modulated signal and the window signal and producing a counter input signal;

counting pulses of the counter input signal and providing a counter output;
resetting the step of counting at the termination of the window; and
converting the counter output at the termination of the window to the analog value.

12. The method of claim 11, further comprising synchronizing the pulse width modulated signal to the clock signal.

13. The method of claim 11, further comprising latching the counter output and providing a latched counter output for conversion to the analog value.

14. The method of claim 13, further comprising providing a reset signal to reset the step of counting.

15. The method of claim 14, further comprising latching the counter output at the termination of the window.

16. The method of claim 13, further comprising resetting the step of counting after latching of the counter output.

17. The method of claim 11, wherein the window is a fixed time duration for a specified clock signal frequency.

18. The method of claim 17, wherein the fixed time duration of the window varies inversely as the clock signal frequency.

19. The method of claim 11, wherein the step of counting pulses of the counter input signal comprises counting clock pulses of the clock signal only during the window of the window signal and only during a duty cycle of the pulsed width modulated signal.

20. The method of claim 11, wherein the counter output is independent of the frequency of the pulse width modulated signal and the clock signal.

* * * * *